United States Patent
Shinmori

(10) Patent No.: US 6,448,798 B1
(45) Date of Patent: Sep. 10, 2002

(54) ELECTRONIC DEVICE SYSTEM INCLUDING SEMICONDUCTOR INTEGRATED CIRCUITS

(75) Inventor: Nobuaki Shinmori, Miyazaki (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/527,392

(22) Filed: Mar. 16, 2000

(30) Foreign Application Priority Data

Sep. 16, 1999 (JP) ............................................. 11-262058

(51) Int. Cl.$^7$ .............................................. G01R 31/28
(52) U.S. Cl. ..................... 324/763; 324/158.1
(58) Field of Search .............................. 324/757, 158.1, 324/765, 527, 763, 537, 73.1; 364/489; 365/230.6

(56) References Cited

U.S. PATENT DOCUMENTS

| | | | |
|---|---|---|---|
| 4,823,803 A | * | 4/1989 | Nakamura |
| 4,979,066 A | * | 12/1990 | Kawata |
| 5,266,894 A | * | 11/1993 | Takagi |
| 5,394,008 A | * | 2/1995 | Ito |
| 5,453,991 A | * | 9/1995 | Suzuki |
| 5,929,715 A | * | 7/1999 | Nakamiya |
| 5,962,868 A | * | 10/1999 | Tanida |
| 6,125,075 A | * | 9/2000 | Watanabe |

* cited by examiner

Primary Examiner—Michael Sherry
Assistant Examiner—Trung Nguyen
(74) Attorney, Agent, or Firm—Volentine Francos, PLLC

(57) ABSTRACT

In an electronic device system which includes integrated circuits, an amount of current which is passes through a resistive element located between a power supply voltage and an internal circuit of each integrated circuit is calculated on the basis of the power supply voltage and an voltage which occurs on an node between the resistive element and the internal circuit.

11 Claims, 8 Drawing Sheets

ELECTRONIC DEVICE SYSTEM INCLUDING SEMICONDUCTOR INTEGRATED CIRCUITS

FIELD OF THE INVENTION

The present invention relates to an electronic device system which includes semiconductor integrated circuits, and which can detect a current consumption of the integrated circuits.

BACKGROUND OF THE INVENTION

In an electronic device system which includes semiconductor integrated circuits, it is necessary to measure an electric current that passes through each integrated circuit. Therefore, the electronic device system includes current detecting circuits.

A conventional electronic device system which includes current detecting circuits is shown in FIG. 8. The electronic device system 800 comprises a plurality of integrated circuits 1 and a plurality of current detecting circuits. In FIG. 8, the current detecting circuits are ammeters 3. One integrated circuit 1 includes an internal circuit 5. This internal circuit 5 comprises any one of various circuits, such as a CPU, a microcontroller, a memory circuit, a logic circuit and so on.

A first terminal 5a of the internal circuit 5 is connected to a power voltage pad 1a which is provided with a power supply voltage VDD from a power supply. A second terminal 5b is connected to a GND pad 1b which is provided with a ground voltage GND.

The ammeter 3 is connected in series between the power voltage pad 1a and the power supply and measures an electric current passing through the internal circuit 5.

In the conventional electronic device system, for each internal circuit, a plurality of ammeters are located in order to measure an electric current passing through each internal circuit. Therefore, it is difficult to reduce the size of the electronic device system.

SUMMARY OF THE INVENTION

An object of the invention is to provide an electronic device system which allows for the size thereof to be reduced.

To achieve the object, according to one aspect of the invention, an amount of current which passes through a resistive element located between a power supply voltage and an internal integrated circuit is calculated on the basis of the power supply voltage and an voltage which occurs on an node between the resistive element and the internal circuit.

According to the present invention, in the electronic device system which includes a plurality of internal integrated circuits, a detecting circuit can be shared to measure an electric current passing through each internal integrated circuit. Therefore, it is possible to reduce the size of the electronic device system.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

The present invention will be described hereinafter with reference to the accompanying drawings. The drawings used for this description typically illustrate major characteristic parts so that the present invention will be easily understood.

Figure 1:
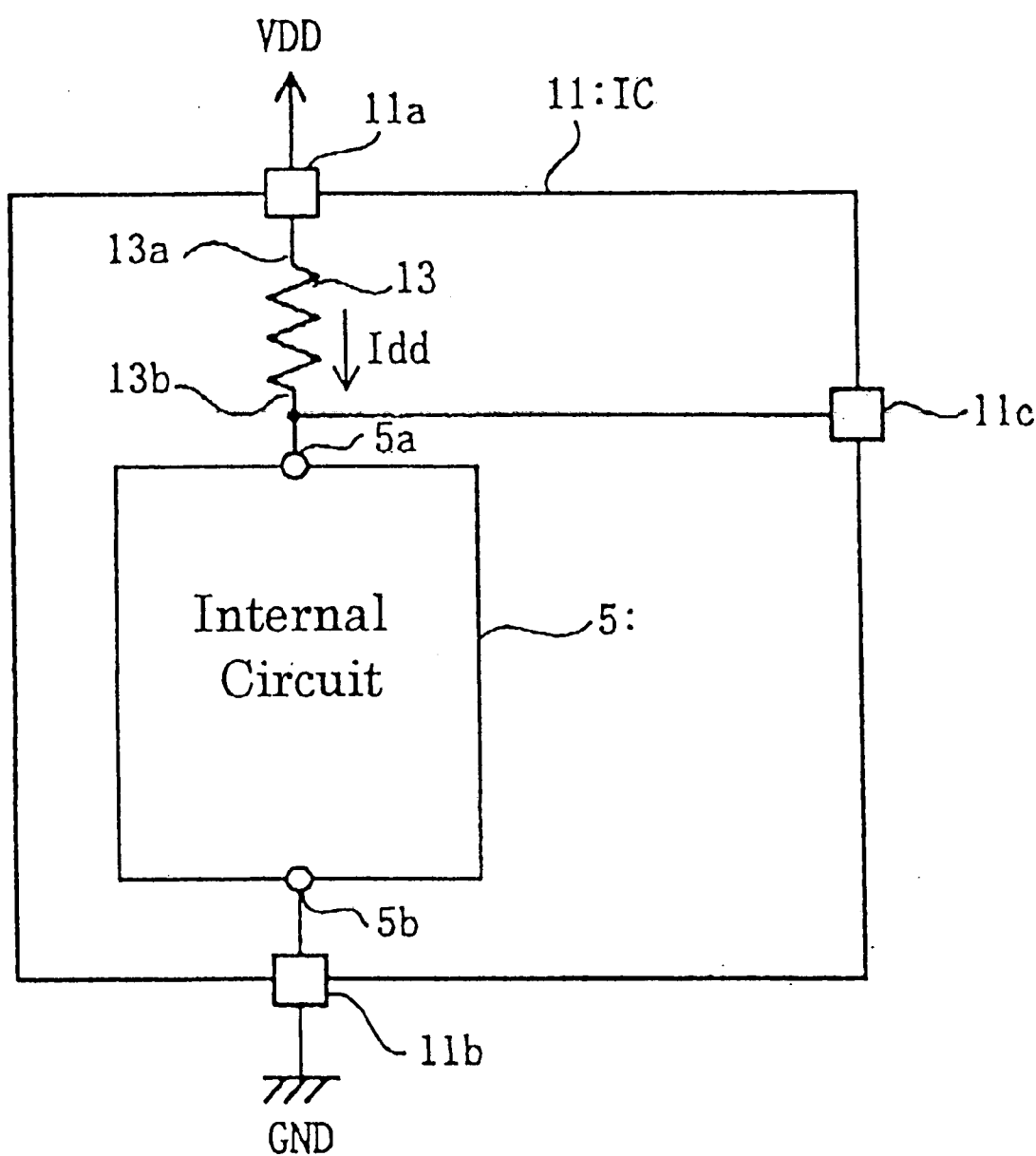
FIG. 1 is a partial circuit diagram of an integrated circuit according to a first preferred embodiment.

A semiconductor integrated circuit 11 according to a first preferred embodiment is shown in FIG. 1. The integrated circuit 11 includes an internal circuit 5. This internal circuit 5 comprises any one of various circuits, such as a CPU, a micro-controller, a memory circuit, a logic circuit and so on.

A first terminal 5a of the internal circuit 5 is connected to a power voltage pad 11a through a resistive element 13. The power voltage pad 11a is provided with a power supply voltage VDD from a power supply.

A first terminal 13a of the resistive element 13 is connected to a power voltage pad 11a, and a second terminal 13b of the resistive element 13 is connected the first terminal 5a of the internal circuit 5. A second terminal 5b of the internal circuit 5 is connected to GND pad 11b which is provided with a ground voltage GND. A resistance R13 of the resistive element 13 is set a predetermined value in consideration of an operative voltage of the internal circuit 5. An output terminal 11c is connected to the second terminal 13b of the resistive element 13.

When the power supply voltage VDD is supplied to the power voltage pad 11a, a current Idd flows into the internal circuit 5 through the resistive element 13. An output voltage Vmo occurs on the output terminal 11c. The current Idd can be considered as representative of a current consumption of the internal circuit 5.

The current Idd is calculated by the following equation.

$$Idd = (VDD - Vmo)/R13$$

Figure 2:
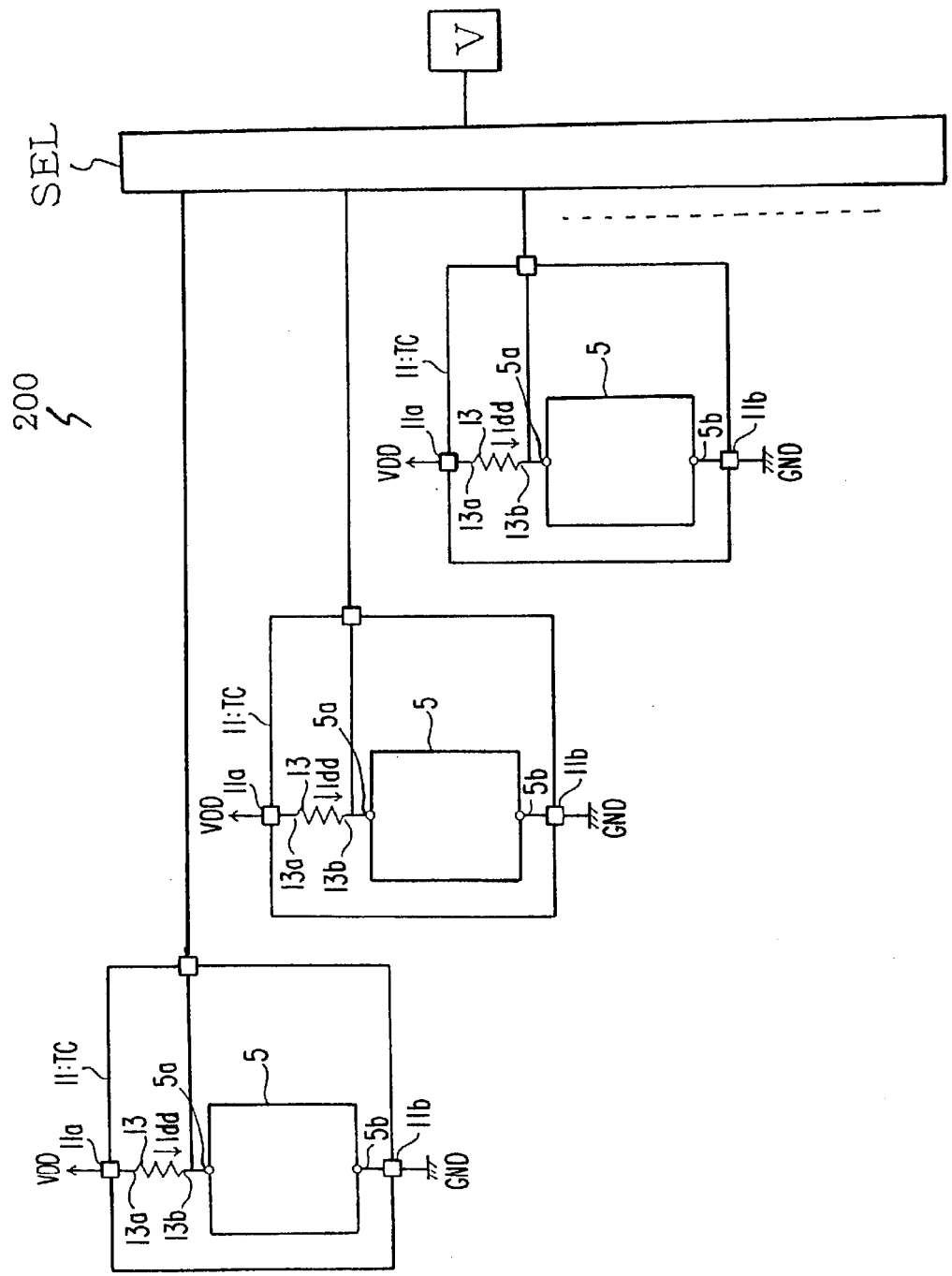
FIG. 2 is a partial circuit diagram of an electronic device system according to the first preferred embodiment.

In this embodiment, the power supply voltage VDD is a voltage of 5 v, the resistance value R13 of the resistive element 13 is a resistance of 10Ω and the output voltage Vmo is a voltage of 4.5 v. So, the current consumption of the internal circuit 5 is as follows: Idd=(5 v−4.5 v)/10Ω=50 mA Here, an electronic device system 200 which includes a plurality of such semiconductor integrated circuits is shown in FIG. 2.

The electric device 200 comprises a plurality of integrated circuits 11, a selector SEL and a detecting circuit. In this embodiment, the detecting circuit is a voltmeter V.

The selector SEL selectively connects the voltmeter V with one of the integrated circuits in response to selection signals. For example, the selector SEL may be comprised of a plurality of MOS transistors, with each having a gate electrode receiving the selection signal.

The detecting circuit measures the output voltage from the internal circuits in turn and calculates a current consumption in the internal circuits.

According to the first preferred embodiment, in the electric device system including a plurality of integrated circuits, with the provision of one detecting circuit and one selector it is possible to measure the current consumption occurring in each integrated circuit.

In this embodiment, a configuration is realized in which the current consumption in a plurality of integrated circuits is measured without using a plurality of ammeters. Therefore, the size of the electronic device system is reduced.

Figure 3:
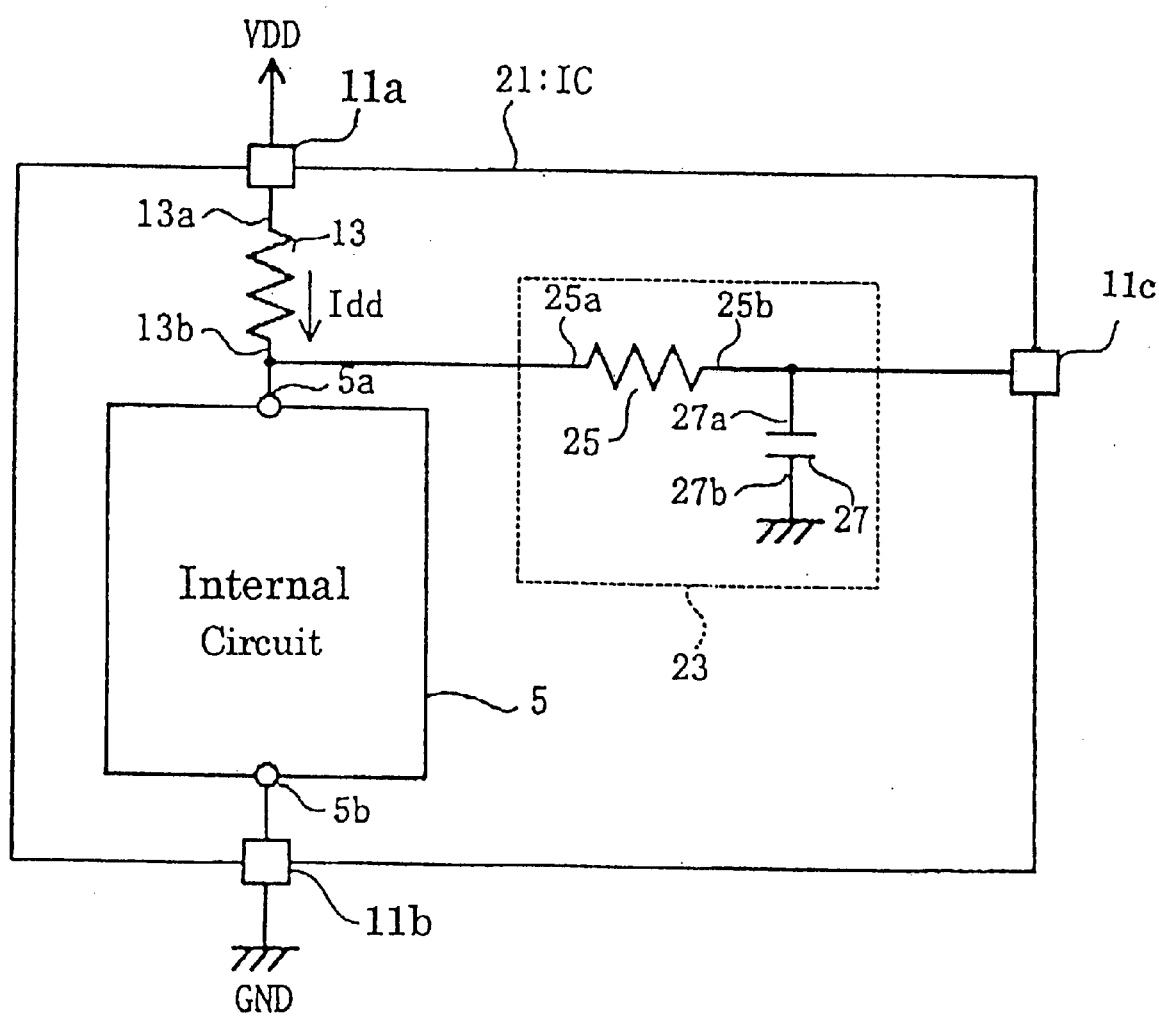
FIG. 3 is a partial circuit diagram of an integrated circuit according to a second preferred embodiment.

An integrated circuit 21 according to a second preferred embodiment is shown in FIG. 3. Naturally, the integrated circuit 21 can be applied to the electronic device system shown in FIG. 2.

In this embodiment, a smoothing circuit 23 is located between the second terminal of the resistive element 13 and the output terminal 11c. In this example, the smoothing circuit 23 is an RC filter comprised of a resister 25 and capacitor 27. The smoothing circuit 23 reduces noise in the voltage occurring on the second terminal 13b and outputs an output voltage to the output terminal 11c.

The second terminal 13b of the resistive element 13 is connected to the output terminal 11c through the smoothing circuit 23. A first terminal 25a of the resister 25 is connected to the second terminal 13b of the resistive element 13, and a second terminal 25b of the resister 25 is connected to a first terminal 27a of the capacitor 27 and the output terminal 21c. A second terminal 27b of the capacitor 27 is connected to the ground GND.

In the first embodiment, during an operation of the internal circuit 5 of the integrated circuit 21, it is possible that the current consumption (Idd) will vary because of the variations in an internal impedance. As a result, the output voltage Vmo which is outputted to the output terminal 11c can vary.

If the current Idd changes from 10 mA to 100 mA, the output voltage Vmo also changes as follows.

$$Vmo = VDD - R13 \times Idd = 5 \text{ v} - (0.1 \text{ v} \sim 1.0 \text{ v}) = 4.0 \text{ v} \sim 4.9 \text{ v} \; (VDD=5 \text{ v}, R13=10\Omega)$$

That is, the current Idd varies within 4.0 v~4.9 v.

Especially in the case where a fluctuation of the output voltage is short, it is difficult to detect the output voltage.

However, in this embodiment, the smoothing circuit 23 can reduce the fluctuation of the voltage on the first terminal 5a of the internal circuit 5 and outputs the output voltage Vmo to the output terminal 11c. That is, the smoothing circuit 23 reduces noise in the output voltage Vmo, making it easier to detect the current consumption.

Figure 4:
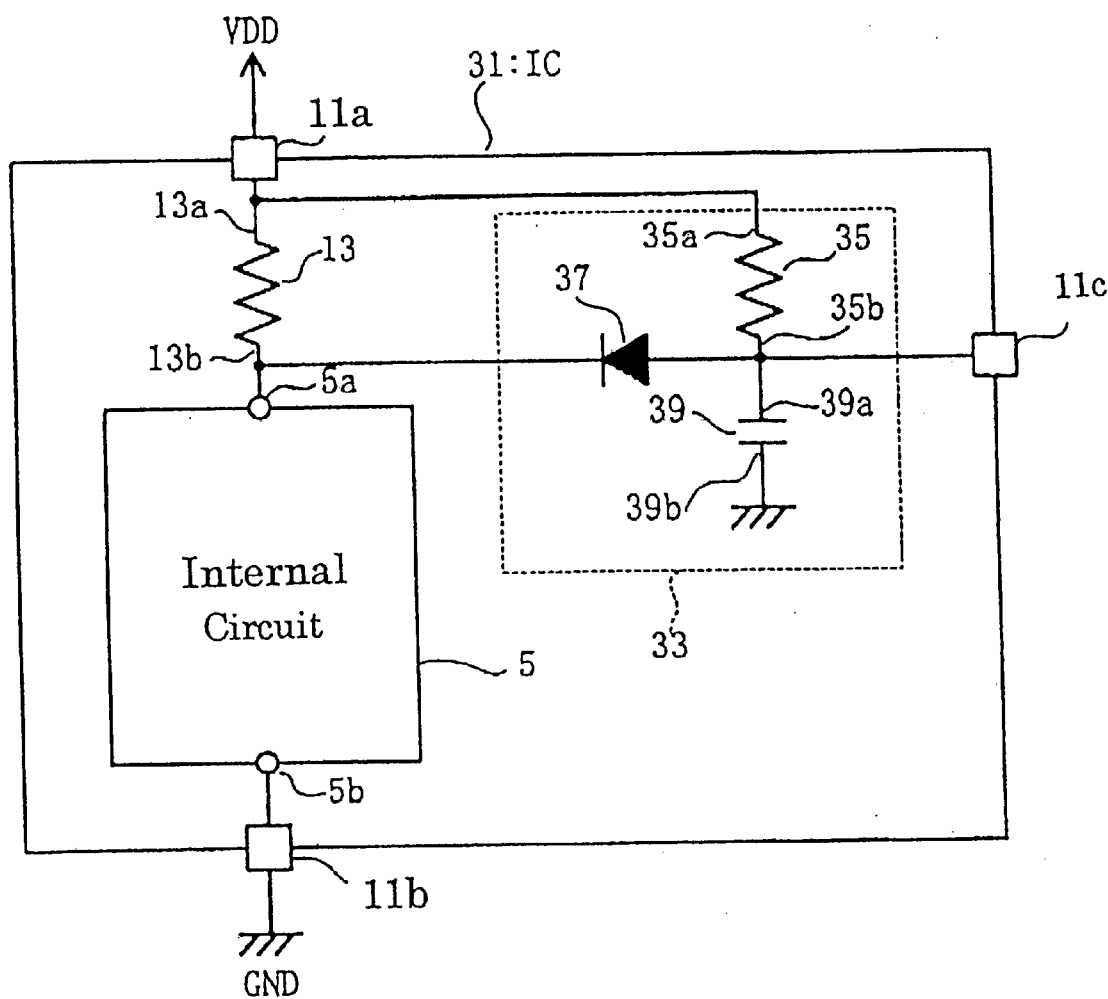
FIG. 4 is a partial circuit diagram of an integrated circuit according to a third preferred embodiment.

An integrated circuit 31 according to a third preferred embodiment is shown in FIG. 4. The integrated circuit 31 can be applied to the electronic device system shown in FIG. 2.

In this embodiment, a voltage holding circuit 33 is located between the second terminal 13b of the resistive element 13 and the output terminal 11c. In this example, the voltage holding circuit 33 is comprised of a resister 35, a diode 37 and a capacitor 39.

A first terminal 35a of the resister 35 is connected to the first terminal 13a of the resistive element 13 and a second terminal 35b is connected to an anode of the diode 37, a first terminal 39a of the capacitor 39 and the output terminal 11c. A cathode of the diode 37 is connected to the second terminal 13b and the first terminal 5a of the internal circuit 5. A second terminal 39b of the capacitor 39 is connected to the ground GND. The resister 35 has a resistance of a few MΩ.

An operation of the integrated circuit 31 illustrated in FIG. 4 is described hereinafter. In this embodiment, the power supply voltage VDD is 5 v, and a forward voltage VF of the diode 37 is 0.4 v.

When the power supply voltage (5V) is supplied to the power voltage pad 11a, the output voltage Vmo (5 v) occurs on the output terminal 11c through the resister 35 of the voltage holding circuit 33.

Here, for example, during an operation of the internal circuit 5, a voltage of the first terminal 5a of the internal circuit is presumed to become a voltage of 4.4 v due to a variation in the internal impedance of the internal circuit. As such, an output voltage Vmo which is a voltage of 4.8 v is outputted to the output terminal 11c (the anode of the diode 37). The voltage of 4.8 v is the sum of the voltage of 4.4 v and the forward voltage VF (0.4 v) of the diode 37.

Then, if a voltage of the first terminal 5a of the internal circuit 5 returns to the power supply voltage (5 v), the output voltage Vmo (4.8 v) on the output terminal 11c will be maintained during a predetermined period by the capacitor 39 of the voltage holding circuit 33.

On the other hand, presume that a voltage of the first terminal 5a of the internal circuit becomes a voltage of 4.1 v due to variation in the internal impedance of the internal circuit 5. As such, an output voltage Vmo which is a voltage of 4.5 v is outputted to the output terminal 11c (the anode of the diode 37). The voltage of 4.5 v is the sum of the voltage of 4.1 v and the forward voltage VF (0.4 v) of the diode 37.

Then, if a voltage of the first terminal 5a of the internal circuit 5 returns to the power supply voltage (5 v), the output voltage Vmo (4.5 v) on the output terminal 11c will be maintained during the predetermined period by the capacitor 39 of the voltage holding circuit 33.

According to the third preferred embodiment, if a voltage on the first terminal 5a of the internal circuit 5 changes due to variation in the internal impedance, a minimum voltage can be outputted from the output terminal 11c by the diode 37. Further, this minimum voltage is held during the predetermined period.

As when a voltage on the first terminal 5a becomes minimum, a consumption current of the integrated circuit 31 becomes maximum. As such, it is easy to monitor the maximum current consumption of the integrated circuit by monitoring the output voltage Vmo on the output terminal 11c.

Figure 5:
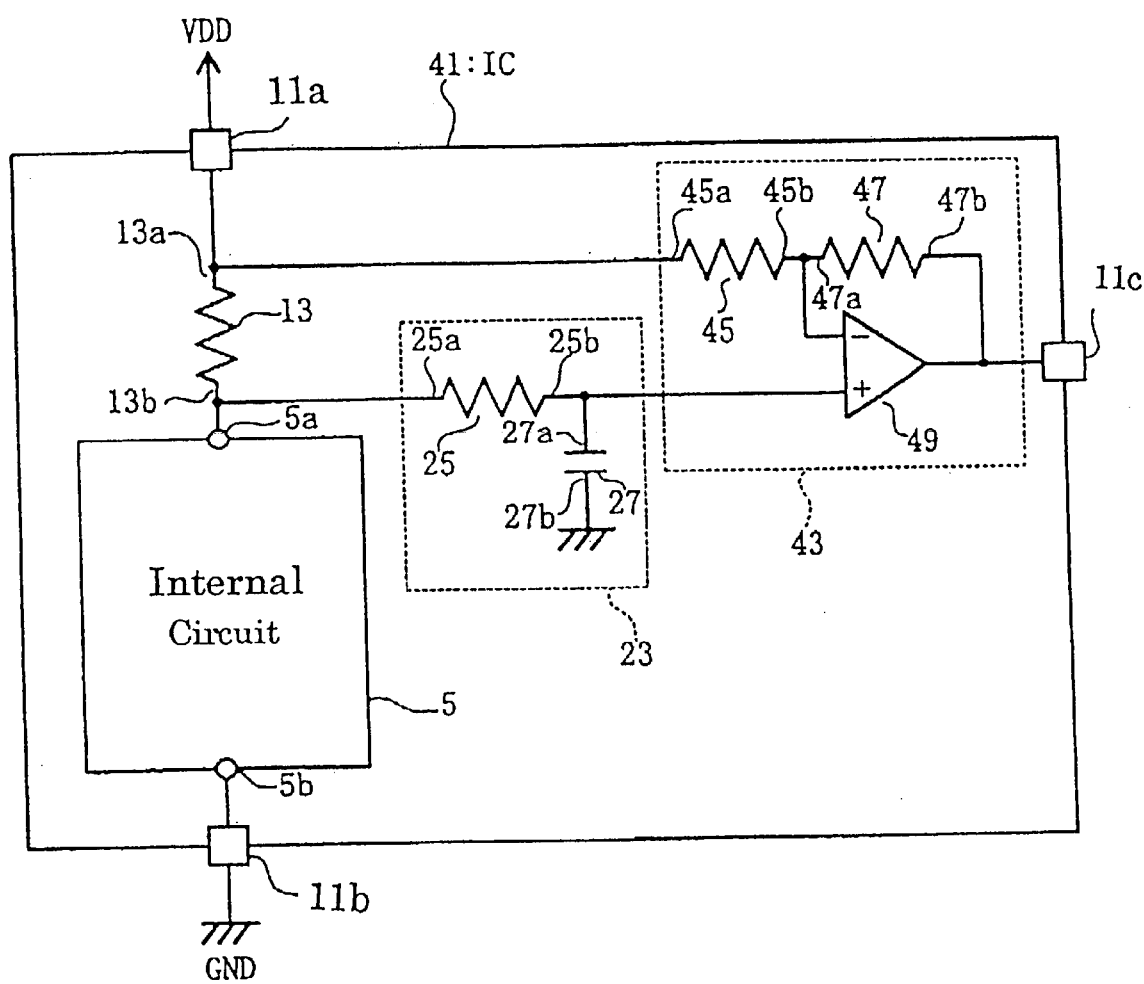
FIG. 5 is a partial circuit diagram of an integrated circuit according to a fourth preferred embodiment.

An integrated circuit 41 according to a fourth preferred embodiment is shown in FIG. 5. The integrated circuit 41 can be applied to the electronic device system shown in FIG. 2.

In this embodiment, a voltage amplifier circuit 43 is located between the smoothing circuit 23, which is shown in FIG. 3, and the first terminal 13a and the output terminal 11c. The voltage amplifier circuit 43 is comprised of resisters 45, 47 and a differential amplifier 49 (op-amplifier).

A first terminal 45a of the resister 45 is connected to the first terminal 13a of the resistive element 13 and the power supply pad 11a. A first terminal(−) of the differential amplifier 49 is connected to a second terminal 45b of the resister 45 and a first terminal 47a of the resister 47. A second terminal(+) of the differential amplifier 49 is connected to the second terminal 25b of the resister 25b and the first terminal 27a of the capacitor 27. An output terminal of the differential amplifier 49 is connected to a second terminal 47b of the resister 47 and the output terminal 11c.

An operation of the integrated circuit 41 illustrated in FIG. 5 is described hereinafter. In this embodiment, the power supply voltage VDD is 5 v, a resistance of the resister 45 is 10 kΩ and a resistance of the resister 47 is 90 kΩ.

The power supply voltage (5V) is supplied to the power voltage pad 11a. When a voltage of the first terminal 5a of the internal circuit 5 becomes 4.9 v, the voltage of 4.9 v is inputted to the second terminal(+) of the differential amplifier 49. As the first terminal(−) of the differential amplifier 49 is inputted a voltage of 4.9 v, a voltage difference between the first terminal 45a and the second terminal 45b becomes 0.1 v.

A current which passes through the resister 45 will pass through the resister 47 because an impedance of the differential amplifier 49 is very high. Therefore, a voltage difference between the first terminal 47a and the second terminal 47b becomes 0.9 v which is nine times that of the resister 45.

Consequently, a voltage of 4.0 v (Vmo) which is the power supply voltage (5.0 v) less a voltage drop (1 v) of the resisters 45,47 is outputted to the output terminal 11c.

According to the fourth embodiment, a voltage drop on the first terminal 5a of the internal circuit 5 is amplified by the voltage amplifier circuit 43 and is outputted to the output terminal 11c. In this embodiment, the voltage drop (0.1 v) is amplified ten times (1.0 v). Therefore, if a chang of the current consumption of the internal circuit is very small, it is possible to monitor it precisely.

A resistance of the resisters and an amplification degree of the differential amplifier can be properly set by designers.

Figure 6:
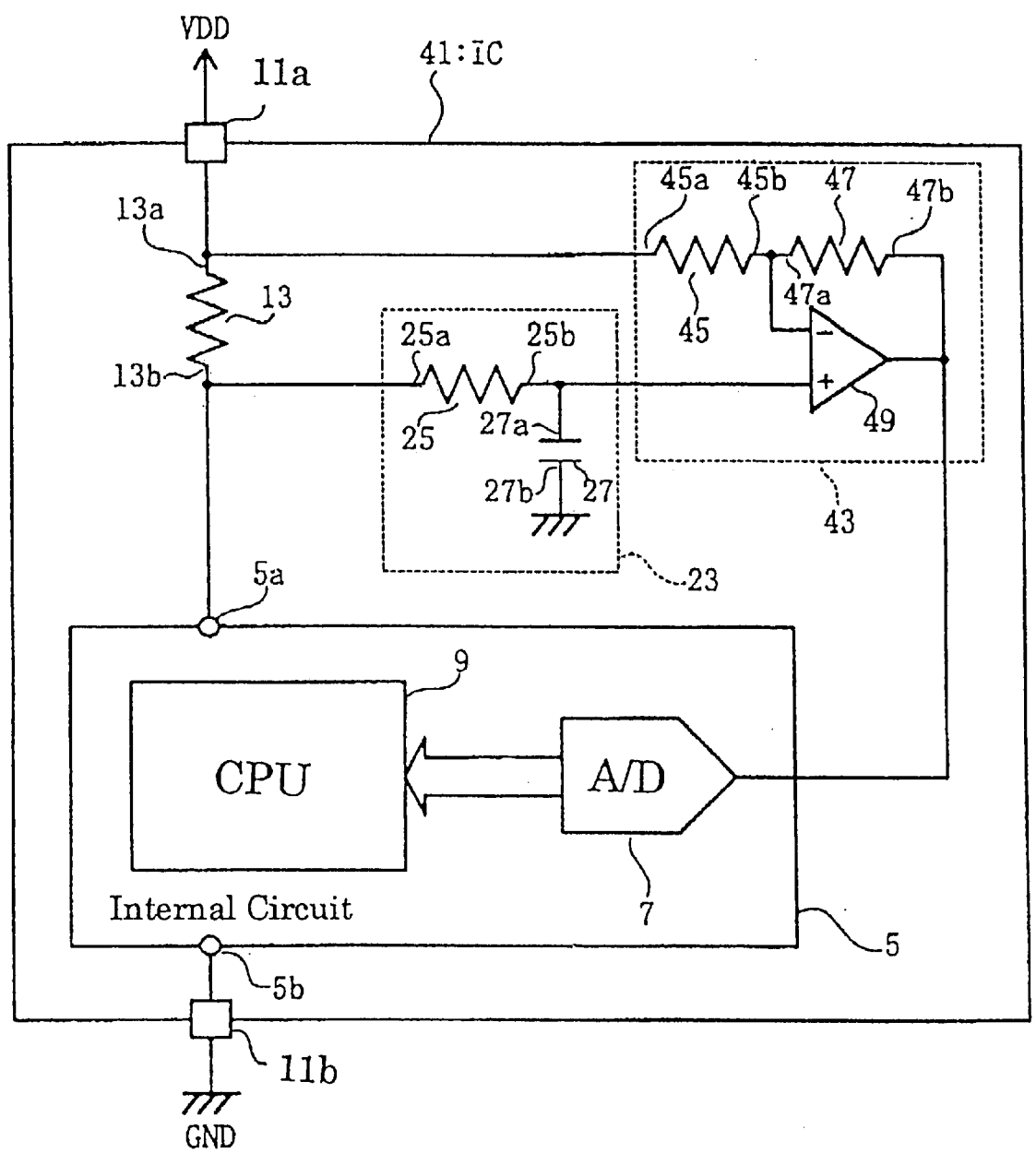
FIG. 6 is a partial circuit diagram of an integrated circuit according to a variational embodiment.

In the case where the integrated circuit 41 is a micro-controller, a variational embodiment is shown in FIG. 6. Naturally, this variation can be applied to the other embodiments.

Generally, an internal circuit 5 of the micro-controller includes analog-to-digital converter (AID converter) 7 and CPU core 9. Here, the output voltage from the voltage amplifier circuit 43 is inputted to an input of the A/D converter 7. The AID converter 7 converts the output voltage which is an analog data to a digital data and outputs the digital data to the CPU core 9 from an output. The CPU core 9 controls the integrated circuit 41 in response to the digital data.

According to this variational embodiment, it is possible to control the integrated circuit in response to the current consumption within the internal circuit without measuring or monitoring from the outside. In the electric device system shown in FIG. 2, it is easy to control for changing modes, such as a power saving mode, based on the consumption current. Further, as the output terminal and the detecting circuit are omitted, system costs are also minimized.

Figure 7:
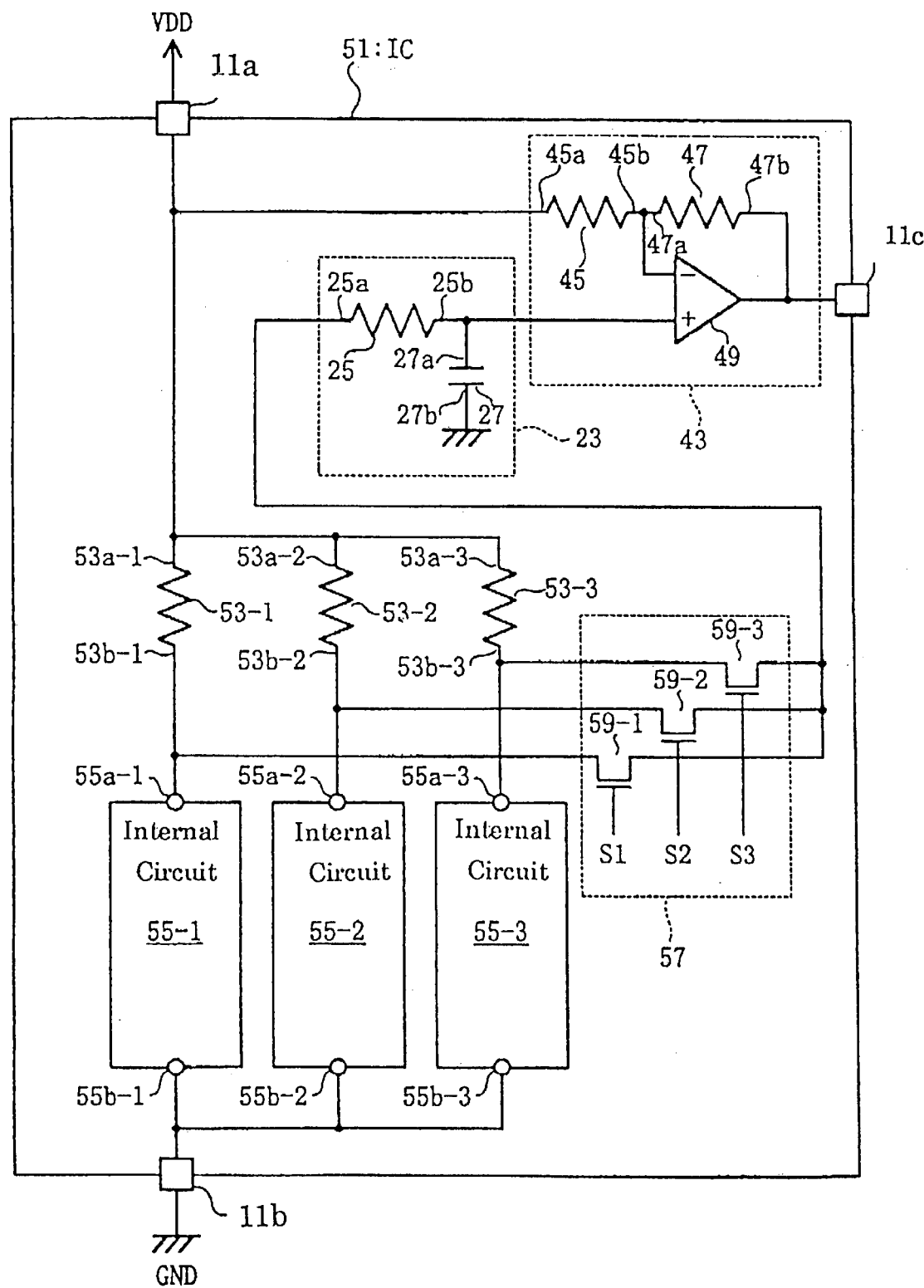
FIG. 7 is a partial circuit diagram of an integrated circuit according to a fifth preferred embodiment.
Figure 8:
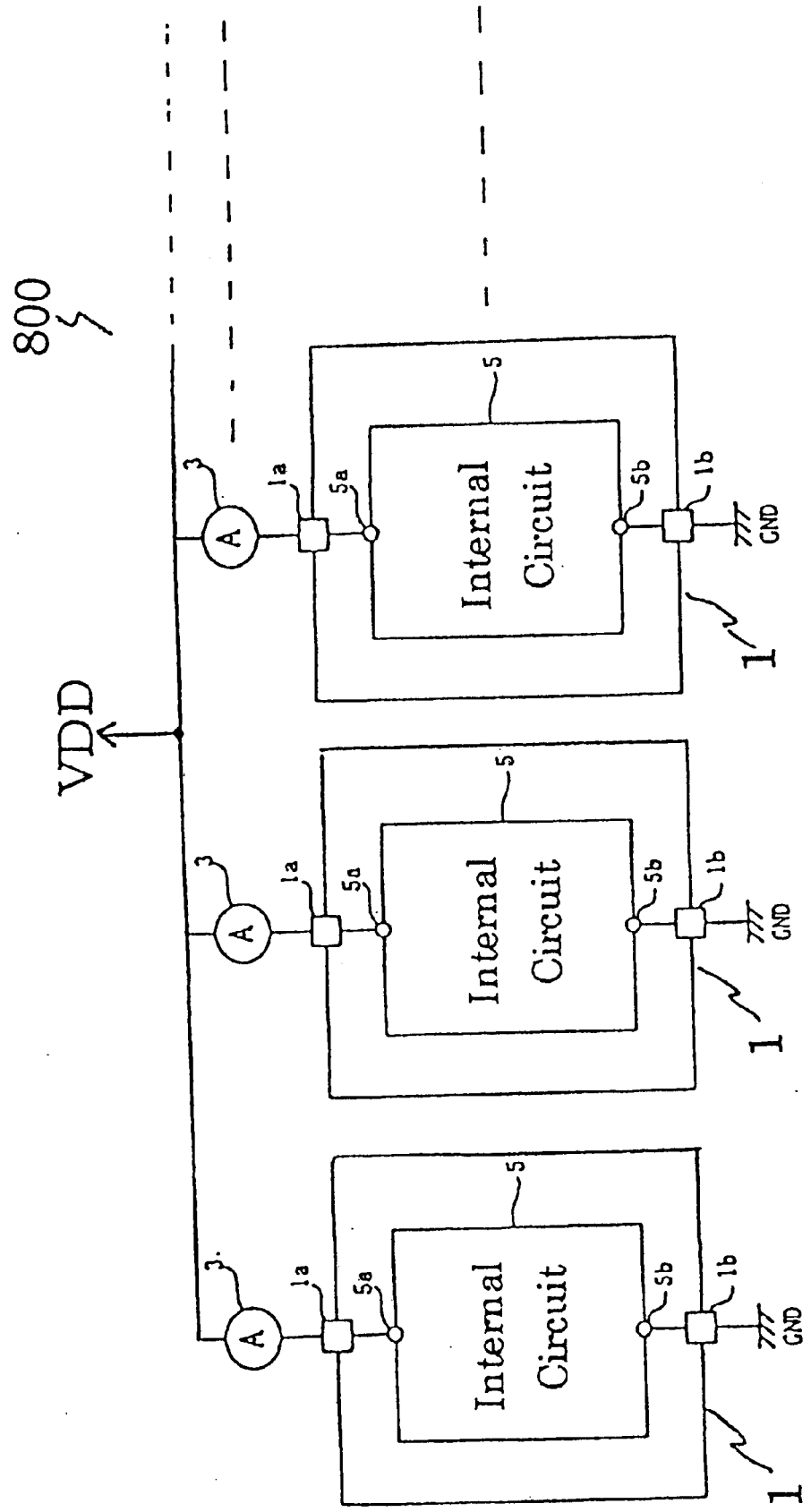
FIG. 8 is a partial circuit diagram according to a conventional electronic device system.

An integrated circuit 51 according to a fifth preferred embodiment is shown in FIG. 7. The integrated circuit 51 can be applied to the electronic device system shown in FIG. 2.

In this embodiment, the integrated circuit 51 is comprised of a first resister 53-1, a second resister 53-2, a third resister 53-3, a first internal circuit 55-1, a second internal circuit 55-2, a third internal circuit 55-3, a selecting circuit 57, the smoothing circuit 23 and the voltage amplifier 43.

The voltage power pad 11a is connected to the first, second and third internal circuit 55-1, 55-2, 55-3 through the resisters 53-1, 53-2 and 53-3. First terminals 53a-1, 53a-2 and 53a-3 are connected to the voltage power pad 11a. A second terminal 53b-1 is connected to a first terminal 55a-1 of the first internal circuit 55-1, a second terminal 53b-2 is connected to a first terminal 55a-2 of the second internal circuit 55-2, and a second terminal 53b-3 is connected to a first terminal 55a-3 of the third internal circuit 55-3. Second terminals 55b-1, 55b-2 and 55b-3 are connected to the ground pad 11b.

The selecting circuit 57 is comprised of a first transistor 59-1, a second transistor 59-2 and a third transistor 59-3. A drain of the first transistor 59-1 is connected to the second terminal 53b-1 of the resister 53-1 and the first terminal 55a-1 of the first internal circuit 55-1. A drain of the first transistor 59-2 is connected to the second terminal 53b-2 of the resister 53-2 and the first terminal 55a-2 of the first internal circuit 55-2. A drain of the first transistor 59-3 is connected to the second terminal 53b-3 of the resister 53-3 and the first terminal 55a-3 of the first internal circuit 55-3. Sources of the transistors of 59-1, 59-2 and 59-3 are connected to the first terminal 25a of the resister 25 in the smoothing circuit 23. Gates of the transistors 59-1, 59-2 and 59-2 selectively receive control signals S1, S2 and S3. The selecting circuit 57 selectively connects the first terminals 55a-1, 55a-2 and 55a-3 with the smoothing circuit 23.

In this embodiment, the control signals S1, S2 and S3 are supplied from the outside of the integrated circuit 51. Also, if the integrated circuit includes a CPU core, the CPU core can generate the control signals.

According to the fifth preferred embodiment, in the case where a plurality of internal circuits are installed in the integrated circuit, it is easy to detect a current consumption of each internal circuit.

The present invention has been described with reference to illustrative embodiments, however, this description must not be considered to be confined only to the embodiments illustrated. Various modifications and changes of these illustrative embodiments and the other embodiments of the present invention will become apparent to one skilled in the art from reference to the description of the present invention. It is therefore contemplated that the appended claims will cover any such modifications or embodiments as fall within the true scope of the invention.

What is claimed is:

1. A semiconductor device comprising:

an internal circuit;

a power supply terminal which receives a power supply voltage;

a resistive element which has a first terminal and a second terminal, wherein the first terminal is connected to the power supply terminal and the second terminal is connected to the internal circuit;

an output terminal which is connected to the second terminal; and a measurement circuit which detects a value indicative of a current passing through the resistive element on the basis of the power supply voltage and an output voltage which occurs on the output terminal; and a smoothing circuit which is connected between the second terminal and the output terminal and which reduces a ripple of the output voltage.

2. A semiconductor device comprising:

an internal circuit;

a power supply terminal which receives a power supply voltage;

a resistive element which has a first terminal and a second terminal, wherein the first terminal is connected to the power supply terminal and the second terminal is connected to the internal circuit;

an output terminal which is connected to the second terminal; and a measurement circuit which detects a value indicative of a current passing through the resistive element on the basis of the power supply voltage and an output voltage which occurs on the output terminal; and a voltage holding circuit which is connected to the first terminal and the second terminal, and which holds a voltage difference between the first and second terminals during a predetermined period.

3. The semiconductor device according to claim 2, wherein the voltage difference is a maximum voltage difference between the first and the second terminals.

4. A semiconductor device comprising:

an internal circuit;

a power supply terminal which receives a power supply voltage;

a resistive element which has a first terminal and a second terminal, wherein the first terminal is connected to the power supply terminal and the second terminal is connected to the internal circuit;

an output terminal which is connected to the second terminal; and a measurement circuit which detects a value indicative of a current passing through the resistive element on the basis of the power supply voltage and an output voltage which occurs on the output terminal;

a smoothing circuit which is connected to the second terminal and which reduces a ripple of a voltage on the second terminal; and an amplifier circuit which is connected between the smoothing circuit and the output terminal and which amplifies a voltage from the smoothing circuit and outputs the output voltage to the output terminal.

5. A semiconductor device comprising:

an internal circuit;

a power supply terminal which receives a power supply voltage;

a resistive element which has a first terminal and a second terminal, wherein the first terminal is connected to the power supply terminal and the second terminal is connected to the internal circuit;

an output terminal which is connected to the second terminal; and a measurement circuit which detects a value indicative of a current passing through the resistive element on the basis of the power supply voltage and an output voltage which occurs on the output terminal;

a second internal circuit, a second resistive element which has a third terminal connected to the power supply terminal and a fourth terminal connected to the second internal circuit, and a selecting circuit which is connected between the second and fourth terminals and the output terminal and which connects the output terminal with either the second terminal or the fourth terminal;

a smoothing circuit which is connected to the selecting circuit and which reduces a ripple of a voltage on the second or fourth terminal; and an amplifier circuit which is connected between the smoothing circuit and the output terminal and which amplifies a voltage from the smoothing circuit and outputs the output voltage to the output terminal.

6. A semiconductor device comprising:

an internal circuit having an A/D converter and a CPU;

a power supply terminal which receives a power supply voltage; and a resistive element which has a first terminal and a second terminal, wherein the first terminal is connected to the power supply terminal and the second terminal is connected to the internal circuit;

wherein the A/D converter is connected to the second terminal, and wherein a voltage on the second terminal is converted to a digital value by the A/D converter and the digital value is inputted to the CPU, and wherein the CPU calculates a value indicative of a current passing through the resistive element on the basis of the voltage which occurs on the second terminal.

7. The semiconductor device according to claim 6, further comprising a smoothing circuit which is connected to the second terminal and which reduces a ripple of a voltage on the second terminal, and an amplifier circuit which is connected between the smoothing circuit and the A/D converter and which amplifies a voltage from the smoothing circuit and outputs an amplified voltage to the A/D converter.

8. An electronic device system comprising:

at least two semiconductor devices, each semiconductor device comprising an internal circuit, a power supply terminal which receives a power supply voltage, a resistive element which has a first terminal and a second terminal, wherein the first terminal is connected to the power supply terminal and the second terminal is connected to the internal circuit, and an output terminal which is connected to the second terminal;

a detecting circuit which measures an output voltage that occurs on the output terminal;

a selecting circuit, connected between the semiconductor devices and the detecting circuit, which selectively connects the semiconductor devices with the detecting circuit; and a smoothing circuit which is connected between the second terminal and the output terminal and which removes a noise occurring in the output voltage.

9. An electronic device system comprising:

at least two semiconductor devices, each semiconductor device comprising an internal circuit, a power supply terminal which receives a power supply voltage, a resistive element which has a first terminal and a second terminal, wherein the first terminal is connected to the power supply terminal and the second terminal is connected to the internal circuit, and an output terminal which is connected to the second terminal;

a detecting circuit which measures an output voltage that occurs on the output terminal;

a selecting circuit, connected between the semiconductor devices and the detecting circuit, which selectively connects the semiconductor devices with the detecting circuit; and a voltage holding circuit which is connected to the first terminal and the second terminal and which holds a voltage difference between the first and second terminals during a predetermined period.

10. The electronic device system according to claim 9, wherein the voltage difference is a maximum voltage difference between the first and the second ends.

11. An electronic device system comprising:

at least two semiconductor devices, each semiconductor device comprising an internal circuit, a power supply terminal which receives a power supply voltage, a resistive element which has a first terminal and a second terminal, wherein the first terminal is connected to the power supply terminal and the second terminal is connected to the internal circuit, and an output terminal which is connected to the second terminal;

a detecting circuit which measures an output voltage that occurs on the output terminal;

a selecting circuit, connected between the semiconductor devices and the detecting circuit, which selectively connects the semiconductor devices with the detecting circuit;

a smoothing circuit which is connected to the second terminal and which removes a noise of a voltage on the second terminal; and an amplifier circuit which is connected between the smoothing circuit and the output terminal and which amplifies a voltage from the smoothing circuit.

* * * * *